United States Patent [19]

Hirooka et al.

[11] Patent Number: 4,751,192
[45] Date of Patent: Jun. 14, 1988

[54] PROCESS FOR THE PREPARATION OF IMAGE-READING PHOTOSENSOR

[75] Inventors: Masaaki Hirooka, Toride; Shunichi Ishihara, Ebina; Junichi Hanna; Isamu Shimizu, both of Yokohama, all of Japan

[73] Assignee: Canon Kabushiki Kaisha, Tokyo, Japan

[21] Appl. No.: 938,997

[22] Filed: Dec. 8, 1986

[30] Foreign Application Priority Data

Dec. 11, 1985 [JP] Japan .................. 60-277002

[51] Int. Cl.$^4$ ............................................. H01L 31/18
[52] U.S. Cl. .......................................... 437/4; 437/3;
437/101; 427/74; 136/258; 423/349
[58] Field of Search .................. 427/74, 86; 148/174;
357/30, 59 C, 59 D; 136/258 AM; 423/349;
430/128; 437/3, 4, 101

[56] References Cited

U.S. PATENT DOCUMENTS

| Re. 31,708 | 10/1984 | Gordon | 427/126.2 |
|---|---|---|---|
| 3,306,768 | 2/1967 | Peterson | 427/255.3 |
| 3,473,978 | 10/1969 | Jackson et al. | 437/93 |
| 3,888,705 | 6/1975 | Fletcher et al. | 437/107 |
| 4,146,657 | 3/1979 | Gordon | 427/126 |
| 4,239,811 | 12/1980 | Kemlage | 437/238 |
| 4,357,179 | 11/1982 | Adams et al. | 437/19 |
| 4,402,762 | 9/1983 | John et al. | 437/16 |
| 4,421,592 | 12/1983 | Shaskus et al. | 156/613 |
| 4,448,801 | 5/1984 | Fukuda et al. | 427/39 |
| 4,462,847 | 7/1984 | Thompson et al. | 437/99 |
| 4,504,518 | 3/1985 | Ovshinsky et al. | 427/38 |
| 4,522,663 | 6/1985 | Ovshinsky et al. | 148/403 |
| 4,527,007 | 7/1985 | Fuse | 136/256 |
| 4,532,199 | 7/1985 | Ueno et al. | 430/128 |
| 4,554,180 | 11/1985 | Hirooka | 427/248.1 |
| 4,615,905 | 10/1986 | Ovshinsky | 427/39 |
| 4,624,736 | 11/1986 | Gee et al. | 156/643 |
| 4,624,906 | 11/1986 | Kawamura et al. | 430/84 |
| 4,637,938 | 1/1987 | Lee et al. | 427/53.1 |
| 4,645,689 | 2/1987 | Cox | 427/255.2 X |
| 4,652,463 | 3/1987 | Peters | 427/53.1 |
| 4,657,777 | 4/1987 | Hirooka | 427/39 |
| 4,689,093 | 8/1987 | Ishihara et al. | 437/5 |

FOREIGN PATENT DOCUMENTS

| 74212 | 3/1983 | European Pat. Off. |
|---|---|---|
| 90586A | 10/1983 | European Pat. Off. |
| 59-199035 | 12/1984 | Japan . |
| 60-43819 | 8/1985 | Japan . |
| 2038086A | 7/1980 | United Kingdom . |
| 2148328A | 5/1985 | United Kingdom . |

OTHER PUBLICATIONS

Brodsky et al., *IBM Technical Disclosure Bulletin*, vol. 22, 3391 (Jan. 1980).
Inoue, *Appl. Phys. Lett.* 43(8), Oct. 15, 1983, p. 774.
Ohnishi et al., Proceedings, 6th E.C. Photovoltaic Solar Energy Conference, London, Apr. 15–19, 1985, pp. 677–681.
Sakai et al., Proceedings, 6th E.C. Photovoltaic Solar Energy Conference, London, Apr. 15–19, 1985, pp. 682–686.

*Primary Examiner*—Aaron Weisstuch
*Attorney, Agent, or Firm*—Fitzpatrick, Cella, Harper & Scinto

[57] ABSTRACT

An improved image-reading photosensor having a desired photoelectric conversion layer prepared in the absence of a plasma by the reaction of a substance capable of contributing to form a deposited film and an electronically oxidizing agent. A process and an apparatus for preparing the improved image-reading photosensor.

6 Claims, 3 Drawing Sheets

FIG. IA
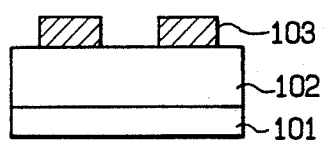
FIG. IB
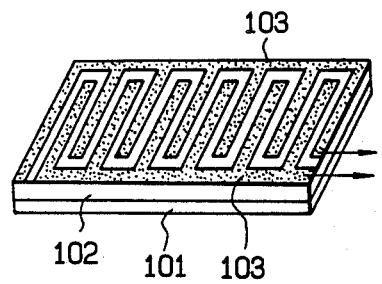
FIG. IC
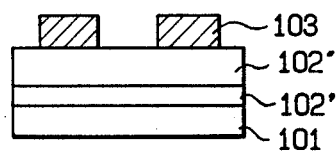
FIG. ID
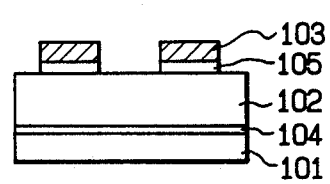
FIG. IE
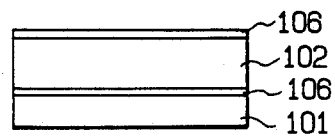

PROCESS FOR THE PREPARATION OF IMAGE-READING PHOTOSENSOR

FIELD OF THE INVENTION

This invention relates to an improved image-reading photosensor using an amorphous semiconducting material, a process and an apparatus for preparing the same.

BACKGROUND OF THE INVENTION

There have been proposed a number of image-reading photosensors for use as an element member in various information processing devices or copying machines.

For instance, in the transmission of facsimile or in a copying machine, there is employed a photosensor having the function of reading images such as manuscript. A representative example in this respect wherein such image-reading photosensor is used is schematically illustrated in FIG. 3, in which are shown image-reading photosensor 301, self-focusing light transmitting body 302 such as SELFOC LENS (registered trademark name of NIPPON GLASS SHEET CO., LTD.) being disposed downward to the photosensor, two light emitting diode (LED) arrays 303, 303 respectively being arranged beside the light transmitting body and a manuscript 304 to be read.

There are known a number of kinds of such photosensors. Among these known photosensors, those wherein a non-monocrystalline semiconducting thin film such as an amorphous semiconducting thin film or polycrystalline semiconducting thin film is used as the photoelectric conversion layer are commonly considered preferable from the view points that it has a wealth of practically applicable photoelectric conversive characteristics and it can be easily sized to a large square measure.

In the known image-reading photosensor using such non-monocrystalline semiconducting material as the photoelectric conversion layer the photoelectric conversion layer composed of a non-monocrystalline semiconducting material is disposed on an electroinsulative substrate. And along with those image-reading photosensors, there have been proposed various methods for preparing the photoelectric conversion layer using vacuum evaporation, ion plating, reactive sputtering, thermo chemical vapor deposition, plasma chemical vapor deposition and photo chemical vapor deposition techniques. Among these methods, the method using plasma vapor deposition (hereinafter referred to as "plasma CVD method") has been generally recognized as being the most preferred and is currently used to manufacture the photoelectric conversion layer.

However, for any of the known photoelectric conversion layers, even if it is an acceptable one that is obtained by the plasma CVD method and exhibits almost satisfactory characteristics, there still remain problems unsolved in totally satisfying the requirements for its characteristics, particularly electric and optical characteristics, photoconductive characteristics, deterioration resistance upon repeated use and use-environmental characteristics, its homogeneity, reproducibility, mass-productivity, and its long term stability and durability, which are required for the photoelectric conversion layer to be a stable one.

The reasons are largely due to the fact that the photoelectric conversion layer cannot be easily prepared by a simple layer deposition procedure but skilled manipulations are required in the process operations in order to obtain a desirable photoelectric conversion layer while having due regard for the starting materials.

For example, in the case of forming a film composed of an amorphous silicon material (hereinafter referred to as "a-Si") according to the thermo chemical vapor deposition technique (hereinafter referred to as "CVD method"), after the gaseous material containing silicon atoms is diluted, appropriate impurities are introduced thereinto and the thermal decomposition of related materials is carried out at an elevated temperature between 500° and 650° C. Therefore, in order to obtain a desirable a-Si film by the CVD method, precise process operation and control are required, and because of this the apparatus in which the process according to the CVD method is practiced becomes complicated and costly. However, even in that case, it is extremely difficult to reproduceably obtain on an industrial scale a desirable homogeneous photoelectric conversion layer composed of an a-Si material having practically applicable characteristics.

Now, although the plasma CVD method is widely used nowadays as above mentioned, it is still accompanied with problems relating to process operations and to capital investment.

Regarding the former problems, the operating conditions to be employed under the plasma CVD method are much more complicated than the known CVD method, and it is extremely difficult to generalize them.

That is, there already exist a number of variations even in correlated parameters concerning the temperature of the substrate, the amount and flow rate of gases to be introduced, the degree of pressure and the high frequency power for forming the layer, the structure of the electrodes, the structure of the reaction chamber, the flow rate of gases to be exhausted, and the plasma generation system. Besides said parameters, there also exist other kinds of parameters.

Under these circumstances, in order to obtain a desirable deposited film product it is required to choose precise parameters from a great number of variables. And sometimes serious problems occur. For instance, because of the precisely chosen parameters, a plasma is apt to be in an unstable state which causes problems in the deposited film.

Also, the structure of the apparatus in which the process using the plasma CVD method is practiced will eventually become complicated since the parameters to be employed are precisely chosen as above stated. Whenever the scale or the kind of the apparatus to be used is modified or changed, the apparatus must be so structured as to cope with the precisely chosen parameters.

In this regard, even if a desirable deposited film should be fortuitously mass-produced, the film product becomes unavoidably costly because (1) a heavy investment is firstly necessitated to set up a particularly appropriate apparatus therefor; (2) a number of process operation parameters still exist even for such apparatus and the relevant parameters must be precisely chosen from the existing various parameters for the mass-production of such films. In accordance with such precisely chosen parameters, the process must then be carefully practiced.

Against this background, image-reading photosensors have become commonplace nowadays. There thus is an increased demand to stably provide a relatively inexpensive image-reading photosensor having a photoelectric conversion layer with a normal square measure or a large square measure being composed of an a-Si material which has a good uniformity and many practically applicable characteristics and which is suited for its use purpose and application.

Consequently there is an earnest desire to develop an appropriate method and apparatus to satisfactorily meet the above demand.

Likewise, there is a similar situation which exists with respect to other kinds of non-monocrystalline semiconducting layers which may constitute the photoelectric conversion layer of an image-reading photosensor, for example, those composed of an a-Si material containing at least one selected from oxygen atoms, carbon atoms and nitrogen atoms.

SUMMARY OF THE INVENTION

The present inventors have conducted extensive studies in order to solve the problems in the aforementioned known methods and in order to develop a new process for effectively and simply preparing an improved image-reading photosensor having a desirable photoelectric conversion layer composed of a non-crystalline semiconducting material, which has a wealth of practically applicable characteristics, without depending upon any known method and which meets the abovementioned demands.

As a result, the present inventors finally have found a process that enables one to efficiently and stably prepare said image-reading photosensor in simplified particular procedures as detailed below.

It is therefore an object of this invention to provide an improved image-reading photosensor provided with a desirable photoelectric conversion layer composed of a non-crystalline semiconducting material which has many practically applicable characteristics, excellent photoelectric conversion functions, and which is prepared without plasma reaction.

Another object of this invention is to provide a process for preparing the improved image-reading photosensor by which the photoelectric conversion layer can be mass-produced with simplified film forming conditions in a film forming space without plasma discharge while maintaining the characteristics of the film to be formed and promoting the film-forming rate.

A further object of this invention is to provide an apparatus suitable for practicing the present process.

These and other objects, as well as the features of this invention will become apparent by reading the following descriptions of preferred embodiments according to this invention while referring to the accompanying drawings.

BRIEF DESCRIPTION OF THE DRAWINGS

FIGS. 1(A) through FIG. 1(E) are schematic views illustrating representative embodiments of an image-reading photosensor according to this invention, in which FIG. 1(A) is a cross-sectional view of a first representative embodiment of an image-reading photosensor according to this invention;

FIG. 1(B) is an isometric view illustrating the whole body of the embodiment as shown in FIG. 1(A);

FIG. 1(C) is a cross-sectional portion view of a second representative embodiment of the image-reading photosensor according to this invention;

FIG. 1(D) is a cross-sectional portion view of a third representative embodiment of the image-reading photosensor according to this invention; and FIG. 1(E) is a cross-sectional portion view of a fourth representative embodiment of the image-reading photosensor according to this invention;

DESCRIPTION OF THE INVENTION

Figure 2:
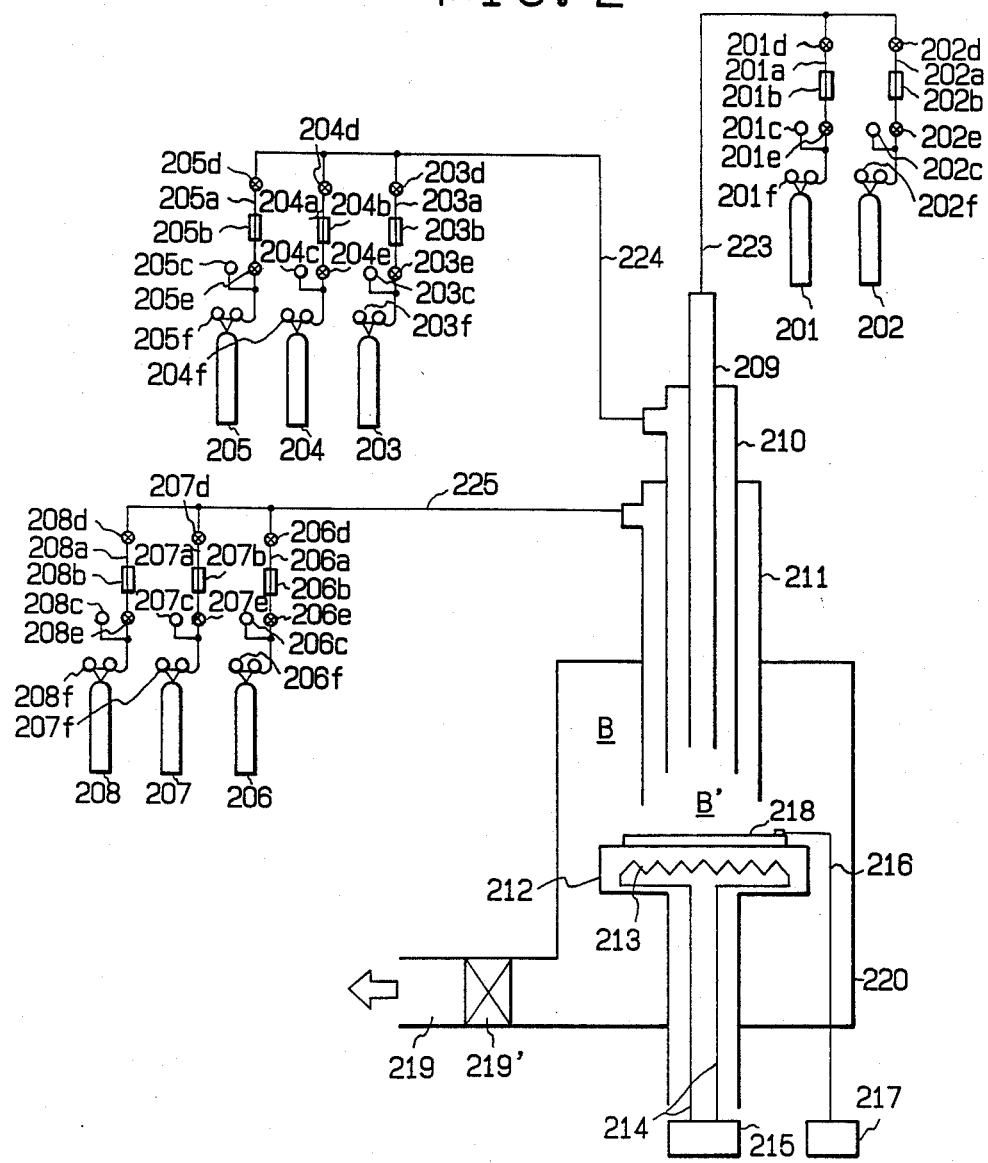
FIG. 2 is a schematic explanatory view of a fabrication apparatus as an example of the apparatus for preparing the image-reading photosensor according to this invention.
Figure 3:
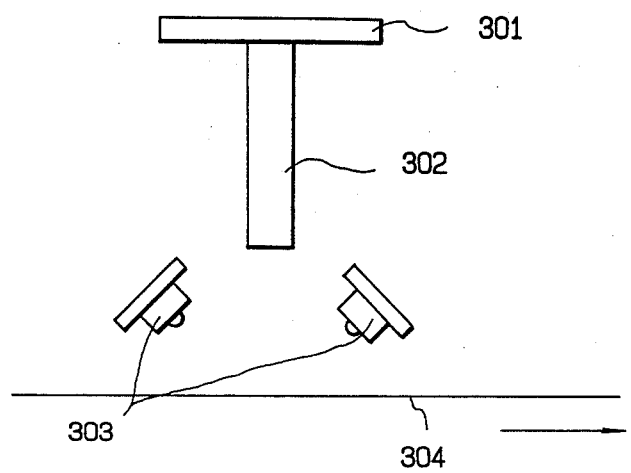
FIG. 3 is a schematic explanatory view of an apparatus wherein an image-reading photosensor is used.

The present inventors have made earnest studies for overcoming the foregoing problems of the conventional image-reading photosensors and attaining the objects as described above and, as a result, have accomplished this invention based on the findings as described below.

That is, (i) a substance which can be a constituent for forming a photoelectric conversion layer but which does not or can hardly contribute to the formation of said layer as long as it remains in its original energy state and (ii) another substance which can chemically react with the substance (i) to electronically oxidize it (which means that the atom, ion or molecule of the substance loses an electron, namely the oxidation number is increased) are selected, and the two substances in gaseous state are separately introduced through respective transporting passages into a film forming space wherein a substrate for the image-reading photosensor being maintained at about 300° C. is placed, thereby letting the two substances collide and contact to cause a chemical mutual reaction between the two substances in the space positioned above the substrate in the film forming space.

As a result, there is formed a homogeneous deposited film with a uniform thickness without accompaniment of any solid particles on the substrate. It is found that the resulting deposited film has a wealth of desirable electric and optical properties and is uniformly accompanied with an excellent photoelectric conversion function.

When an image-reading photosensor is prepared in accordance with the above procedures, there is obtained a desirable image-reading photosensor having many practically applicable characteristics, deterioration resistance upon repeated use and use-environmental characteristics and having an excellent photoelectric conversion function. As a result, it was confirmed that this method is of sufficient repeatability.

This invention has been completed based on these findings, and it includes an improved image-reading photosensor, a process, and an apparatus for preparing the same.

That is, according to one aspect of this invention, there is provided an improved image-reading photosensor comprising a substrate, a photoelectric conversion layer formed thereon, and electrodes electrically connected to the photoelectric conversion layer, the photoelectric conversion layer being a layer which is formed by introducing (i) a gaseous substance which can be a constituent for forming a deposited film but which does not or can hardly contribute to form said film as long as it remains in its original energy state (hereinafter referred to as "a substance contributing to form a photoelectric conversion layer" or "a substance contributing to form a deposited film") and (ii) a gaseous substance having a property to electronically oxidize the substance (i) (hereinafter referred to as "an electronically oxidizing agent") separately through respective gas transporting spaces into a film forming space wherein the substrate is placed while being maintained at a predetermined temperature, making the two substances (i) and (ii) contact each other in the absence of a plasma in the space positioned over the surface of the substrate to thereby generate a plurality of precursors containing excited precursors and causing at least one type of these precursors to be directed to form said film.

According to another aspect of this invention, there is provided a process for preparing an improved image-reading photosensor, characterized by (a) employing together a substance contributing to form a deposited film and an electronically oxidizing agent, (b) passing the substance in a gaseous state through a transportation space leading to a film forming space wherein a substrate for an image-reading photosensor is placed while being maintained at a predetermined temperature, (c) passing the electronically oxidizing agent in a gaseous state through the other transportation space leading to the film forming space and (d) chemically contacting the substance (i) and the electronically oxidizing agent (ii) in the absence of a plasma in the space positioned above the surface of the substrate to thereby generate a plurality of precursors containing excited precursors and causing at least one type of these precursors to be directed to form a deposited film as a photoelectric conversion layer for the image-reading photosensor.

According to a further aspect of this invention, there is provided an apparatus suitable for practicing the above process, characterized by a conduit for transporting a substance contributing to form a deposited film and a conduit for transporting an electronically oxidizing agent being so disposed that the substance (i) and the electronically oxidizing agent (ii) may be smoothly introduced into the space positioned above the surface of a substrate for an image-reading photosensor maintained at a predetermined temperature in a film forming chamber and sufficiently contacting each other in the absence of a plasma, thereby generating a plurality of precursors containing excited precursors and causing at least one type of these precursors be directed to form a deposited film as a photoelectric conversion layer of an image-reading photosensor.

According to this invention, there can be obtained a desirable photoelectric conversion layer in a simple process in the absence of a plasma without having any negative influence due to plasma etching or any problem due to abnormal discharge action since the process does not depend upon the conventional plasma CVD method using a gaseous plasma formed by subjecting the starting gaseous materials to the action of electrical discharge energy.

In addition, according to this invention, there are provided the following advantages; a desirable photoelectric conversion layer for an image-reading photosensor having a uniform thickness and a desirable homogeneity may be effectively formed at an improved film forming rate in simple procedures without consumption of as much energy as in the conventional plasma CVD method; the operating parameters for preparing a photoelectric conversion layer for an image-reading photosensor may be significantly simplified; an improved image-reading photosensor having such desirable photoelectric conversion layer or if necessary, of a large square measure may be mass-produced on an industrial scale to thereby reduce the cost of such product; and a heavy investment such as for the apparatus used in the conventional plasma CVD method is not necessitated even for a particularly appropriate apparatus to practice the process of this invention.

DESCRIPTION OF THE PREFERRED EMBODIMENTS

The starting substance to be used as the foregoing substance contributing to form a photoelectric conversion layer of the image-reading photosensor of this invention (hereinafter referred to by the term "starting substance A") is a substance which can be a constituent for forming said layer but which does not or can hardly contribute to form said layer as long as it remains in its original energy state, as previously mentioned. But it is required for the starting substance to generate a plurality of precursors containing excited precursors when it is chemically contacted with the foregoing electronically oxidizing agent.

The starting substance A is chosen appropriately in accordance with the type of, the desired characteristics, and/or the use purpose of the photoelectric conversion layer.

For the starting substance A, any gaseous, liquid or solid substance may be used as long as it meets the above condition and it can be easily made to be in the gaseous state when chemically contacted with said oxidizing agent.

When a liquid or solid substance is employed as the starting substance A, it is contacted with an inert gas such as Ar, He, $N_2$, or $H_2$, and, if necessary, while being heated, to thereby generate a gas of the substance, which is then introduced into the film forming space.

For the foregoing electronically oxidizing agent, a gaseous substance is used. The oxidizing agent must have the property of easily causing an excitation of the starting substance A due to the electronic oxidation action of the oxidizing agent from chemical contact between the two substances.

Therefore, usable as such oxidizing agent are, for example, oxygen gases such as air, oxygen ($O_2$) and ozone ($o_3$), oxygen atom containing substances or nitrogen atom containing substances such as dinitrogen oxide ($N_2O$), dinitrogen trioxide ($N_2O_3$) and dinitrogen tetraoxide ($N_2O_4$), peroxides such as hydrogen peroxide ($H_2O_2$), halogen gases such as $F_2$, $Cl_2$, $Br_2$ and $I_2$, and nascent state halogens such as nascent fluorine, chlorine and iodine.

In the case where a liquid or solid substance is chosen as the oxidizing agent, it is contacted with an inert gas such as Ar, He, $N_2$ or $H_2$ and if necessary, while being heated, to thereby generate a gas of the substance, which is then introduced into the film forming space in the same manner as in the case of the starting substance A.

The aforementioned starting substance A and the aforementioned electronic oxidizing agent are introduced separately through respective transporting passages into a film forming space with an appropriate flow rate and under an appropriate pressure condition and collided with each other to cause chemical contact between the two substances thereby inviting the starting substance to be electronically oxidized by the oxidizing agent to effectively generate a plurality of precursors containing excited precursors. At least one species of the resulting precursors is caused to form a deposited film for the photoelectric conversion layer of an image-reading photosensor on a substrate maintained at a predetermined temperature in the film forming space.

In the above film forming process, the exited precursor generated therein becomes another precursor of another species of excited precursor through successive decomposition or chemical reaction, or it sometimes liberates energy. In any case, the excited precursor contacts the surface of the substrate maintained at a predetermined temperature in the film forming space and causes the formation of a deposited film having a three dimensional network structure on the substrate. In this system, the energy level of the excited precursor generated as a result of the chemical contact between the starting substance A and the oxidizing agent is preferred to be either such that it relaxes to a lower energy level or such that it is accompanied by a radiative emission during the process when the excited precursor is changed into other chemical species. Because the generation of a plurality of precursors containing such excited precursor is accompanied with an emission during its energy transition, the formation process of the photoelectric conversion layer of the image-reading photosensor effectively proceeds with a lower consumption of energy to thereby obtain an improved image-reading photosensor provided with a desirable photoelectric conversion layer with a uniform thickness and a desirable homogeneity and which has an excellent photoelectric conversion function.

Representative embodiments of the image-reading photosensor according to this invention will now be explained more specifically referring to the drawings. The description is not intended to limit the scope of the invention.

The image-reading photosensors as shown in FIGS. 1(A), 1(C) and 1(D) are of the type wherein irradiation of light is conducted from the side of the substrate, and include substrate 101, photoelectric conversion layer 102 including layers 102' and 102'', open-patterned type electrode 103, under coat layer 104, and ohmic contact layer 105.

The image-reading photosensor as shown in FIG. 1(E) is of the type wherein irradiation of light is conducted from the side of the substrate and also from the side of the photoelectric conversion layer, and includes transparent substrate 101, photoelectric conversion layer 102, and transparent electrode 106.

In any of the above image-reading photosensors, the substrate 101 is electrically insulative.

The electrically insulative substrate can include, for example, a film or sheet of synthetic resins such as polyester, polyethylene, polycarbonate, cellulose acetate, polypropylene, polyvinyl chloride, polyvinylidene chloride, polystyrene, and polyamide, glass, ceramics, and paper.

The thickness of the substrate is selected so that a desired image-reading photosensor is obtained. However, the thickness is usually greater than 10 μm in view of the fabrication and handling or mechanical strength of the substrate.

The photoelectric conversion layer comprises a semiconductive non-monocrystalline material, preferably, an amorphous material containing silicon atoms (Si) as the main constituent, and if necessary at least one of hydrogen atoms (H) and halogen atoms (X) (hereinafter referred to as "a-Si (H, X)"). Also, it may optionally contain electroconductive substances.

The halogen atom (X) includes, specifically, flourine, chlorine, bromine and iodine, fluorine and chlorine being particularly preferred. The amount of the hydrogen atoms (H), the amount of the halogen atoms (X) or the sum of the amounts of the hydrogen atoms and the halogen atoms (H+X) contained in the photoelectric conversion layer 102 is usually from 1 to 40 atm % and, preferably, from 5 to 30 atm %.

In the case when only the halogen atom (X) is contained in the photoelectric conversion layer 102, its amount is preferably at least 0.001 atomic %, more preferably, 0.01 atomic % and most preferably, 0.1 atomic %.

It is possible to make the photoelectric conversion layer 102 either n-type or p-type by appropriately doping the layer with an n-type impurity or a p-type impurity while controlling the amount of impurity present when the layer is being formed.

Usable as impurities are, for example, elements of Group IIIA of the Periodic Table such as B, Al, Ga, In, Tl and the like for the p-type impurity, and elements of Group VA of the Periodic Table such as N, p, As, Sb, Bi and the like for the n-type impurity. Of these impurities, B, Ga, P and Sb are the most appropriate.

In order for the photoelectric conversion layer 102 to have a desired type of conductivity, the amount of an impurity with which the layer 102 is doped may be determined appropriately depending upon its desired electrical and optical characteristics.

For the impurities of Group IIIA of the Periodic Table, the amount used will be less than $3 \times 10^{-2}$ atomic %, and in the case of the impurities of Group VA of the Periodic Table, the amount used will be less than $5 \times 10^{-3}$ atomic %.

In addition, the photoelectric conversion layer 102 of the image-reading photosensor according to this invention may be of a multi-layered structure possessing an optical multi-band gap.

FIG. 1(C) illustrates a typical embodiment in that case, in which the photoelectric conversion layer is composed of layers 102' and layer 102''.

The formation of such a multi-layered photoelectric conversion layer possessing optical multi-band gaps may be carried out by introducing at least one element selected from oxygen atoms (O), carbon atoms (C), nitrogen atoms (N), germanium atoms (Ge) and tin atoms (Sn) as the band gap adjusting element into the layer during its formation process.

That is, in one example of the embodiment shown in FIG. 1(C), the layer 102' is composed of a-Si (H, X) containing at least one selected from oxygen atoms (O), carbon atoms (C), nitrogen atoms (N), germanium atoms (Ge) and tin atoms (Sn)[hereinafter referred to as "a-Si (O, C, N, Ge, Sn)(H, X)'"]and the layer 102'' is composed of a-Si (H, X) not containing any of the above elements or containing one or more elements different from those contained in the layer 102' or containing the same elements as those contained in the layer 102'.

The aforesaid multi-layered photoelectric conversion layer possessing an optical multi-band gap may be also formed by varying the film formation rate on the substrate. For example, the formation of the layer 102' is carried out at a high film formation rate and the formation of the layer 102'' is carried out at a low film formation rate.

In the case of the embodiments of the image-reading photosensor according to this invention as shown in FIGS. 1(A), 1(C), 1(D) and 1(E), the thickness of the photoelectric conversion layer is selected depending upon the requirements for the photoelectric conversion layer of the image-reading photosensor to be prepared.

In general, the thickness of the photoelectric conversion layer is preferably 0.05 to 100 μm, more preferably, 0.1 to 50 μm, and most preferably, 0.5 to 30 μm.

In the image-reading photosensor according to this invention, there may be disposed an undercoat layer 104 between the substrate 101 and the photoelectric conversion layer 102 as shown in the embodiment of FIG. 1(D). As the undercoat layer, there can be mentioned a layer composed of a-Si(H,X) containing nitrogen atoms, namely a-SiN(H,X) or $Si_3N_4$.

The open-patterned type electrode 103 in the image-reading photosensor according to this invention is composed of a conductive material and is preferred to be such that it forms an ohmic contact with the photoelectric conversion layer 102.

As the conductive material to bring about said ohmic contact, a metal having a lower work function such as Al and In or a low resistance film composed of a-Si(H,X) doped with a large amount (usually more than 100 ppm) of an element of Group V of the Periodic Table such as P or As may be used in the case of using a non-doped film composed of a-Si(H,X) as the photoelectric conversion layer. However, as an alternative, as shown in FIG. 1(D), there can be disposed an ohmic contact layer 105 composed of a-Si(H,X) doped with a large amount of an element of Group V between the electrode 103 composed of a conductive material such as Al and the photoelectric conversion layer 102.

In addition, in the case of the image-reading photosensor shown in FIG. 1(E) for which the irradiation of light is conducted from the side of the substrate 101 and also from the side of the photoelectric conversion layer 102, transparent electrodes composed of $In_2O_3$ are disposed between the transparent substrate 101 and the photoelectric conversion layer 102 and also on the photoelectric conversion layer 102.

In any of the embodiments of the image-reading photosensor according to this invention as shown in FIGS. 1(A), 1(C), 1(D) and 1(E), there can be disposed an insulative layer (not shown) on the top surface. Usable as the constituent material for the insulative layer are, for example, a-Si(H,X) containing nitrogen atoms, insulative inorganic materials such as $Si_3N_4$ and insulative organic resins.

It is also possible to first dispose an open-patterned type electrode on the substrate and then form a photoelectric conversion layer thereon. (not shown)

For the preparation of such image-reading photosensors according to this invention, not only the photoelectric conversion layer 102 containing a-Si(H,X) as the main constituent but also the undercoat layer 104 comprising a-SiN(H,X) and the insulative layer comprising a-SiN(H,X) can be formed respectively in accordance with the foregoing procedures. Desired layers having many practically applicable characteristics to meet the requirements are made by selecting the proper kind of starting substance A and electronically oxidizing agent and an appropriate combination thereof and introducing them separately into the film forming space as previously mentioned.

That is, in the case of forming a layer composed of a-Si(H,X), a gaseous or gasifiable silicon hydride (silane) such as $SiH_4$, $Si_2H_6$, $Si_3H_8$ and $Si_4H_{10}$ or a gaseous or gasifiable halogen-substituted silicon hydride such as $SiH_3Cl$, $SiH_3F$ and $SiH_3Br$ may be preferably used as the starting substance A.

As the electronically oxidizing agent in that case, a halogen gas such as $F_2$, $Cl_2$, $Br_2$ and $I_2$ or a nascent state halogen such as fluorine, chlorine and iodine may be preferably used. And among these substances, $F_2$ gas and $Cl_2$ gas are most preferred.

In the case of forming a layer composed of a-Si(H,X) containing p-type impurities, an appropriate starting substance to impart such p-type impurities is used in addition to the foregoing two substances.

Usable as such starting substance are, for example, compounds containing the Group III atoms as their constituents such as $B_2H_6$, $B_4H_{10}$, $B_5H_9$, $B_6H_{10}$, $B_6H_{12}$, $Al(CH_3)_3$, $C_2H_5)_3$, $Ga(CH_3)_3$ and $In(CH_3)_3$. Among these compounds, $B_2H_6$ is most preferred.

Further in the case of forming a layer composed of a-Si(H,X) containing n-type impurities, an appropriate starting substance to impart such n-type impurities is used in addition to the foregoing two substances.

Usable as such starting substance are, for example, compounds containing Group V elements as their constituents such as $PH_3$, $P_2H_4$, $AsH_3$, $SbH_3$ and $BiH_3$. Among these compounds, $PH_3$ is most preferred.

In the case of forming a relevant layer composed of a-Si(O, C, N, Ge, Sn)(H, X), there is used a gaseous gasifiable compound containing nitrogen atoms as its constituents, such as $N_2$, $NH_3$, $H_2NNH$, $HN_3$ or $NH_4N_3$, or a gaseous or gasifiable hydrocarbon compound such as $CH_4$, $C_2H_2$, $C_2H_4$, $C_2H_6$, $C_3H_6$ or $C_3H_8$, or a gaseous or gasifiable germane such as $G_2H_4$, $Ge_2H_6$, $Ge_3H_8$, $Ge_4H_{10}$ or $Ge_5H_{12}$, or $SnH_4$ instead of part of the foregoing silane or halogen-substituted silicon hydride as the starting substance A. And as the electronically oxidizing agent, at least one kind of oxygen gas or nitrogen gas selected from $O_2$, $O_3$, $N_2O$, $N_2O_3$ and $N_2O_4$ may be used.

In the process for preparing an improved image-reading photosensor according to this invention, the conditions for forming the photoelectric conversion layer and other layers, for example, the combination of the starting substance A with the electronically oxidizing agent, their mixing ratios, the gas pressure upon mixing those substances in the film forming space, their gas flow rates, the internal pressure upon forming a layer on the substrate, the carrier gas flow rate, the temperature of the substrate and the flow type of each gaseous substance when introduced into the film forming space are important factors for obtaining the image-reading photosensor having desired characteristics and they are appropriately selected while considering the functions of the layer to be formed. Further, since these layer forming conditions are correlated and may be varied depending upon the kind and the amount of each of the atoms contained in the layer, the conditions are to be determined taking these relationships into consideration.

The volume ratio of the starting substance A to the electronically oxidizing agent on the basis of the flow ratio is preferably 1/100 to 100/1, and more preferably, 1/50 to 50/1.

As for the volume ratio of the gaseous substance containing the p-type impurity or the n-type impurity as its constituent to the starting substance A on the basis of the flow ratio is preferably $1/10^6$ to 1/10, more preferably, $1/10^5$ to 1/20, and most preferably, $1/10^5$ to 1/50.

The gas pressure in the film forming space when the starting substance A is mixed with the electronically oxidizing agent is preferred to be higher in order to facilitate their chemical contact. But it is necessary to be determined with due regard to their reactivities. Therefore, it is preferably $1 \times 10^{-7}$ to 10 atmospheres pressure, and more preferably, $1 \times 10^{-6}$ to 3 atmospheres pressure.

The internal pressure in the film forming space, namely, the pressure of the inner space wherein the substrate is placed is appropriately determined with due regard to the excited precursors to be generated in the above inner space and to the conditions necessary for those precursors derived from the excited precursors to become effective in forming a deposited layer.

The internal pressure in the film forming space in the case where the reaction region is open to the film forming region can be adjusted with the use of a differential exhausting means or a large scale exhausting device while having due regard to the correlated conditions relating to the inlet pressure and the inlet flow rate for each of the gaseous starting substance A, the electronically oxidizing agent and the gaseous starting substance to impart a p-type or n-type impurity when they are introduced into the reaction region of the film forming space.

In the case where the gas flow rate of the connecting part between the reaction region and the film forming region is relatively small, the internal pressure in the film forming region can be adjusted by controlling the amount of the exhausting gas by operating an exhausting device connected to the film forming region.

Further in the case where the reaction region and the film forming region are united and they are not structurally separated, it is desirable to conduct the gas exhaustion with a differential gas exhausting means or with the use of a large scale gas exhausting device.

As above mentioned, the internal pressure in the film forming space is determined while having due regard for the correlated pressure conditions in introducing the starting substance A, the electronically oxidizing agent and the substance to impart p-type or n-type impurities into the film forming space.

However, in general, the internal pressure is preferably, 0.001 to 100 Torr, more preferably, 0.01 to 30 Torr, and most preferably, 0.05 to 10 Torr.

As for the form of the gas flows into the film forming space for each of the foregoing substances, they are appropriately designed with due regard to the geometrical arrangement of the gas flow inlet, the substrate and the gas flow outlet so that the starting substance A, the electronically oxidizing agent and the substance to impart p-type or n-type impurities are effectively introduced into and homogeneously and well mixed in the predetermined region of the film forming space to generate desired precursors and to bring about the effective formation of a deposited film on the substrate.

The temperature of the substrate upon forming a deposited film thereon is properly determined according to the kind of gaseous substance to be employed and also to the kind of deposited film to be formed.

That is, in the case of forming a deposited film composed of an amorphous material, it is preferably room temperature to 450° C., and more preferably, 50° to 450° C. Specifically, in the case of forming a deposited film composed of a-Si(H,X) having a desired photoelectric conversion characteristic, it is preferred to be 70° to 350° C. And, in the case of forming a deposited film composed of a polycrystalline material, it is preferably 200° to 650° C., and more preferably, 300° to 600° C.

The atmospheric temperature in the film forming space is properly determined with due regard to the temperature of the substrate so that desired precursors are effectively generated, and those precursors as generated and other precursors derived from the former precursors are not changed into undesired species during the film forming process in the film forming space.

The advantages of this invention are now described in more detail by reference to the following Examples 1 and 2, which are provided here for illustrative purposes only, and are not intended to limit the scope of this invention.

In each of the examples, the corresponding layer of the image-reading photosensor according to this invention is formed by using the fabrication apparatus as shown in FIG. 2.

The fabrication apparatus as shown in FIG. 2 comprises a vacuum chamber having a film forming space with which a gas supplying system and a gas exhausting system are provided.

In FIG. 2, there are shown gas reservoirs 201 through 208, gas supply pipes 201a through 208a respectively extended from the gas reservoirs 201 through 208, mass flow controllers 201b through 208b being placed respectively on the gas supply pipes 201a through 208a for controlling the flow rate of gas from each of the gas reservoirs, pressure gages 201c through 208c, main valves 201d through 208d, sub-valves 201e through 208e and gas reservoir pressure gages 201f through 208f.

With vacuum chamber 220, there are provided first gas supply conduit 209, second gas supply conduit 210 and third gas supplying conduit 211 which are extended into a film forming space B of the vacuum chamber through its upper wall and whose ends leave a space B' sufficient to form a reaction region for a substrate 218 to be placed therein.

As for the first, second and third gas supply conduits 209, 210 and 211, a concentric triple conduit having a first circular space serves as the first gas supply conduit 209, a second circular space serves as the second gas supply conduit 210 and a cylindrical space positioned in the middle serves as the third gas supply conduit 211.

The end portion of the concentric triple conduit in the film forming space B is desired to be in such a form providing an inwardly indented surface with a round space B' acting as the reaction region. The outlet of each of the gas supplying conduits 209, 210 and 211 is downwardly opened at the inwardly indented surface.

As an alternative, the end portion of the concentric triple conduit may be structured in such a way that the outlet of the third gas supply conduit 211 of cylindrical form is positioned in the innermost recess and the remaining end portion composed of the outlets of the first and second gas supply conduits is in a diagonally cut surface form so as to leave a space in the form of conic trapezoid B' acting as the reaction region.

To the first gas supply conduit 209, a gas feed pipe 223 for the gas from the gas reservoirs 201 and 202 is connected. To the second gas supplying conduit 210, a gas feed pipe 224 for the gas from the gas reservoirs 203, 204 and 205 is connected. And to the third gas supplying conduit, a gas feed pipe 225 for the gas from the gas reservoirs 206, 207 and 208 is connected.

At the bottom part of the vacuum chamber 220 there is provided an exhaust pipe 219 having a vacuum valve 219'. The exhaust pipe 219 is connected to a exhaust device (not shown). The air or gas in the gas feeding pipes 223, 224 and 225, the gas supply conduits 209, 210 and 211 and the vacuum chamber 220 can be evacuated by operating the exhaust device through the exhaust pipe 219.

The substrate 218 is placed on substrate holder 212 which can be shifted upwardly or downwardly with a driving means (not shown), and in which a heater is installed. The heater 213 is electrically connected to an electric power source 215 through lead wires 214, 214. In order to measure the temperature of the substrate 218, there is provided a thermocouple 216 electrically connected to a temperature indicator 217.

The position of the substrate 218 upon forming a deposited film thereon is appropriated adjusted by shifting the substrate holder 212 so that there is left a desired distance between the surface of the substrate 218 and the outlets of the gas supply conduits 209, 210 and 211.

Such desired distance is determined depending upon the kind of deposited film to be formed, its desired characteristics, the flow rate of gas to be employed, the internal pressure in the vacuum chamber and the like.

However, in general, it is preferably several millimeters to 20 cm, and more preferably 5 mm to 15 cm.

The heater 213 is operated usually to heat the substrate 218 to an appropriate temperature or to conduct a preliminary heat treatment of the substrate. However, the heater 213 can be used to anneal the deposited film formed on the substrate.

EXAMPLE 1

An image-reading photosensor of the type as shown in FIG. 1(A) was prepared using the apparatus as shown in FIG. 2.

In this example, the distance between the outlet of the gas supply conduit 211 of the concentric triplicate conduit and the surface of the substrate 218 was adjusted to be 3 cm.

As the substrate 218, a glass plate of 1 mm in the thickness and 10 cm×5 cm in size was used. The glass plate was treated with a 1.0% aqueous solution of NaOH, washed with distilled water and then air-dried.

The glass plate was firmly fastened to the surface of the substrate holder 212 placed at the predetermined position in the vacuum chamber 220. The air in the film forming space B was evacuated by opening the vacuum valve 219′ to bring the space to a vacuum of about $10^{-5}$ Torr. Then, the heater 213 was actuated to uniformly heat the glass plate (substrate) 218° to 250° C., and the plate was maintained at this temperature.

SiH$_4$ gas from the reservoir 201 was fed into the reaction region B′ through the gas supply conduit 209 at a flow rate of 10 SCCM. At the same time, F$_2$ gas from the reservoir 206 and He gas from the reservoir 207 were fed into the reaction region at respective flow rates of 2 SCCM and 40 SCCM through the gas supplying conduit 211. After the flow rates of the gases became stable, the vacuum in the vacuum chamber 220 was brought to and maintained at about 0.8 Torr by regulating the vacuum valve 219′. There was then observed a strong blue luminescence throughout the reaction region B′, namely all over the confluent part of the gas from the gas supply conduit 209 and the gas from the gas supply conduit 211 and the surface of the glass plate 218.

After 2 hours, it was found that an a-Si:H:F film of about 1.0 μm in thickness was uniformly deposited on the glass plate 218.

The feeds of all the gases were terminated by closing the corresponding valves, the heater was switched off, and the vacuum atmosphere in the vacuum chamber was opened to atmospheric pressure by opening the vacuum valve 219′.

After the glass plate 218 cooled to room temperature, it was taken out from the vacuum chamber 220. Then the glass plate was placed in another vacuum chamber (not shown) and a combshaped Al electrode of about 500 Å in thickness, 2.5 cm in gap length and 0.2 mm in gap interval was formed on the surface of the film deposited on the glass plate in accordance with a known vacuum deposition method to obtain an objective image-reading photosensor.

Electric current through the photosensor was measured by impressing a voltage on the resulting photosensor.

As a result, it was found that the ratio of electric current under light irradiation to electric current under a dark condition was $1 \times 10^{28}$. There was no change in this numerical value, even after light irradiation for 24 hours.

In a comparative example, the same procedures of Example 1 were repeated except that the known plasma CVD method was employed to form a-Si:H:F film on the glass plate, to thereby obtain an image-reading photosensor.

This comparative photosensor was evaluated by the same procedure as mentioned above.

As a result, it was found that the ratio of electric current under light irradiation to that under a dark condition for the comparative photosensor was $1 \times 10^{34}$ at the beginning, but decreased to $1 \times 10^{23}$ after light irradiation for 24 hours.

EXAMPLE 2

An image-reading photosensor of the type as shown in FIG. 1(D) which comprises a glass plate 101 (substrate), an undercoat layer 104 composed of an a-SiN:H:F, a photoelectric conversion layer 102 composed of a-Si:H:F, an ohmic contact layer 105 composed an a-Si:H:F:P doped with phosphorus atoms (P), and an aluminum electrode 103.

In this example, the distance between the outlet of the gas supplying conduit 211 of the concentric triple conduit and the surface of the substrate 218 was adjusted to be 4 cm.

As the substrate 218, a glass plate of 1 mm in thickness and 10 cm×5 cm in size was used. The glass plate was treated with a 1.0% aqueous solution of NaOH, washed with distilled water and then air-dried. This glass plate was firmly attached to the surface of the substrate holder 212 placed at the predetermined position in the vacuum chamber 220. The air in the film forming space B was evacuated by opening the vacuum valve 219′ to bring the space to a vacuum of about $10^{-5}$ Torr. Then the heater 213 was actuated to uniformly heat the glass plate (substrate) 218° to 200° C., and the plate was maintained at this temperature.

SiH$_4$ gas from the reservoir 201 and NH$_3$ gas from the reservoir 202 were fed into the reaction region B′ through the gas supply conduit 209 at respective flow rates of 30 SCCM. At the same time, F$_2$ the gas from the reservoir 206 and He gas from the reservoir 207 were fed into the reaction region at respective flow rates of 5 SCCM and 45 SCCM through the gas supply conduit 211.

After the flow rates of the gases became stable, the vacuum in the vacuum chamber 220 was brought to and maintained at about 1.0 Torr by regulating the vacuum valve 219′. There was then observed a strong blue luminescence throughout the reaction region B′, namely all over the confluent part of the gas from the gas supply conduit 209 and the gas from the gas supply conduit 211 and the surface of the glass plate 218.

After 3 minutes, it was found that an a-SiN:H:F film of about 1000 A in thickness was uniformly deposited on the glass plate 218.

Then, the feed of NH₃ gas was stopped by closing the main valve 202d and the sub-valve 202e on the pipe 202a, the feeds of SiH₄ gas, F₂ gas and He gas were continued at respective flow rates of 30 SCCM, 5 SCCM and 45 SCCM. After 1 hour, it was found that an a-Si:H:F layer of about 1.0 μm in thickness was uniformly formed on the a-SiN:H:F layer.

Then, while a gas containing 500 ppm of PH, in He gas (hereinafter referred to as "PH₃/He gas") from the reservoir 203 was fed at a flow rate of 6 SCCM into the reaction region B', the feeds of SiH₄ gas, F₂ gas and He gas were continued at respective flow rates of 30 SCCM, 5 SCCM and 45 SCCM. After one minute, it was found that an n-type a-Si:H:F:P layer of about 3000 A in thickness was uniformly formed on said A-Si:H:F layer.

The feeds of all the gases was terminated by closing the corresponding valves, the heater was switched off, and the vacuum atmosphere in the vacuum chamber was opened to atmospheric pressure by opening the vacuum valve 219'.

After the glass plate 218 was cooled to room temperature, it was taken out from the vacuum chamber 220. Then the glass plate was placed in another vacuum chamber (not shown) and a comb shaped Al electrode of about 500 A in thickness, 2.5 cm in gap length and 0.2 mm in gap interval was formed on the surface of the film deposited on the glass plate in accordance with a known vacuum deposition method to obtain an image-reading photosensor.

The characteristics of the resulting image-reading photosensors were examined in accordance with the same procedures as in Example 1, wherein light irradiation was conducted from the side of the glass plate.

As a result, it was found that the ratio of electric current under light irradiation to electric current under a dark condition was $1 \times 10^{4.0}$. There was no change in this numerical value, even after light irradiation for 24 hours.

What we claim is:

1. In the process for preparing an improved image-reading photosensor having a substrate, a photoelectric conversion layer formed from a film of non-single crystalline semiconductor material and an electrode electrically connected to the photoelectric conversion layer, the improvement which comprises:
   (a) introducing via first gas transportation conduit into an evacuated film-forming space having said substrate therein a gaseous substance (i) capable of being a constituent for said film, but essentially incapable of contributing to the formation of said film in its original energy state, and separately through a second gas transportation conduit concentric with said first gas transportation conduit a gaseous substance (ii) capable of electronically oxidizing the substance (i), said first and second concentric gas transportation conduits terminating adjacent said substrate;
   (b) chemically contacting said gaseous substances (i) and (ii) in the absence of a plasma in the space adjacent the surface of said substrate; said substrate being maintained at an elevated temperature to generate a plurality of precursors containing excited precursors and to cause at least one of said precursors to form the film constituting the photoelectric conversion layer; and
   (c) maintaining the distance between the outlet of said first and second concentric gas transportation conduits and the surface of said substrate from 5 mm to 15 cm.

2. The process of claim 1 wherein the gaseous substance (i) contains silicon atoms.

3. The process of claim 1 wherein the gaseous substance (i) contains silicon atoms and either a chemical element for imparting p-type conductivity or a chemical element for imparting n-type conductivity.

4. The process of claim 1 wherein the chemical contacting of said substances (i) and (ii) and the formation of said deposited film occur in a luminescent atmosphere.

5. The process of claim 1 wherein said gas transportation conduit is a concentric triple conduit having open ends facing the surface of the substrate.

6. The process of claim 1 wherein said gas transportation conduit is a concentric triple conduit having open ends facing the substrate, wherein the middle end is positioned in the innermost recess encircled by two other ends so as to form a circular space or a conic trapezoidal space.

* * * * *

UNITED STATES PATENT AND TRADEMARK OFFICE
CERTIFICATE OF CORRECTION

PATENT NO. : 4,751,192

DATED : June 14, 1988

INVENTOR(S) : MASAAKI HIROOKA, ET AL.

It is certified that error appears in the above-identified patent and that said Letters Patent is hereby corrected as shown below:

COLUMN 1

Line 34, "view points" should read --viewpoints--.
Line 35, "conversive" should read --conversion--.
Line 46, "thermo chemical" should read --thermochemical--.
Line 47, "photo chemical" should read --photochemical--.
Line 62, "long term" should read --long-term--.

COLUMN 2

Line 5, "thermo chemical" should read --thermochemical--.
Line 17, "reproduceably" should read --reproducibly--.

COLUMN 3

Line 14, "carbon atoms" should read --carbon atoms,--.
Line 27, "abovementioned" should read --above-mentioned--.

COLUMN 4

Line 44, "characteristics," should read --characteristics such as electric and optical characteristics,--.

COLUMN 5

Line 41, "be directed" should read --to be directed--.

COLUMN 6

Line 40, "($o_3$)," should read --($O_3$),--.

UNITED STATES PATENT AND TRADEMARK OFFICE
CERTIFICATE OF CORRECTION

PATENT NO. : 4,751,192

DATED : June 14, 1988

INVENTOR(S) : MASAAKI HIROOKA, ET AL.

It is certified that error appears in the above-identified patent and that said Letters Patent is hereby corrected as shown below:

COLUMN 7

Line 1, "exited" should read --excited--.
Line 2, "of" should read --or--.
Line 9, "three dimensional" should read --three-dimensional--.

COLUMN 8

Line 18, "p," should read --P,--.
Line 50, ""a-Si (O, C, N, Ge, Sn)(H,X)""]" should read --"a-Si (O, C, N, Ge, Sn)(H,X)"]--.

COLUMN 9

Line 17, "lower" should read --low--.
Line 47, "thereon. (not shown)" should read --thereon (not shown).--.

COLUMN 10

Line 11, "$C_2H_5)_3$," should read --$AlC_2H_5)_3$,--.
Line 21, "relevant" should be deleted.
Line 23, "gasifiable" should read --or gasifiable--.

COLUMN 11

Line 13, "large scale" should read --large-scale--.
Line 27, "Further" should read --Further,--.
Line 31, "large scale" should read --large-scale--.

UNITED STATES PATENT AND TRADEMARK OFFICE
CERTIFICATE OF CORRECTION

PATENT NO. : 4,751,192
DATED : June 14, 1988
INVENTOR(S) : MASAAKI HIROOKA, ET AL.

It is certified that error appears in the above-identified patent and that said Letters Patent is hereby corrected as shown below:

COLUMN 12

Line 23, "gages" should read --gauges--.
Line 25, "gages" should read --gauges--.
Line 40, "in such" should read --of such--.
Line 55, "supplying" should read --supply--.
Line 57, "supply-" should read --supply--.
Line 58, "ing conduit," should read --conduit 211,--.
Line 63, "a" should read --an--.
Line 64, "feeding" should read --feed--.

COLUMN 13

Line 10, "appropriated" should read --appropriately--.
Line 34, "in the" should read --in--.
Line 51, "supply-" should read --supply--.
Line 52, "ing" should be deleted.

COLUMN 14

Line 1, "cooled" should read --was cooled--.
Line 4, "combshaped" should read --comb-shaped--.
Line 5, "500 A" should read --500 Å--.
Line 7, "posted" should read --posited--.
Line 8, "objective" should be deleted.
Line 15, "$1 \times 10^{28}$." should read --$1 \times 10^{3.8}$.--.
Line 27, "$1 \times 10^{34}$" should read --$1 \times 10^{3.4}$--.
Line 28, "$1 \times 10^{23}$" should read --$1 \times 10^{2.3}$--.
Line 34, "an" (second occurrence) should be deleted.
Line 40, "supplying" should read --supply--.
Line 46, "water" should read --water,--.

UNITED STATES PATENT AND TRADEMARK OFFICE
CERTIFICATE OF CORRECTION

PATENT NO. : 4,751,192

DATED : June 14, 1988

INVENTOR(S) : MASAAKI HIROOKA, ET AL.

It is certified that error appears in the above-identified patent and that said Letters Patent is hereby corrected as shown below:

COLUMN 15

Line 4, "1000 A" should read --1000 $\overset{\circ}{A}$--.
Line 13, "PH," should read --$PH_3$--.
Line 20, "A" should read --$\overset{\circ}{A}$--.
Line 22, "was" should read --were--.
Line 30, "comb shaped" should read --comb-shaped--.
Line 31, "500 A" should read --500 $\overset{\circ}{A}$--.
Line 47, "photoeletric" should read --photoelectric--.

COLUMN 16

Line 4, "first" should read --a first--.

Signed and Sealed this

Twenty-first Day of March, 1989

*Attest:*

DONALD J. QUIGG

*Attesting Officer*  *Commissioner of Patents and Trademarks*